United States Patent [19]
Honda

[11] Patent Number: 5,640,352
[45] Date of Patent: Jun. 17, 1997

[54] CONTROL CIRCUIT FOR OUTPUT BUFFER CIRCUITS OF A SEMICONDUCTOR MEMORY DEVICE

[75] Inventor: Masahiko Honda, Tokyo, Japan

[73] Assignee: NEC Corporation, Tokyo, Japan

[21] Appl. No.: 536,660

[22] Filed: Sep. 29, 1995

[30] Foreign Application Priority Data

Sep. 29, 1994 [JP] Japan ................................ 6-235153

[51] Int. Cl.$^6$ .......................................... G11C 11/409
[52] U.S. Cl. ................................ 365/189.05; 365/233.5
[58] Field of Search .................... 365/189.05, 230.08, 365/233.5

[56] References Cited

U.S. PATENT DOCUMENTS

| 5,295,117 | 3/1994 | Okada | 365/189.05 |
| 5,345,421 | 9/1994 | Iwamura et al. | 365/189.05 |
| 5,369,611 | 11/1994 | Miura | 365/189.05 |

*Primary Examiner*—Joseph A Popek
*Attorney, Agent, or Firm*—Young & Thompson

[57] ABSTRACT

The present invention may provide a control circuit for controlling a number of output buffer circuits coupled to memory cells for outputting the read out data of the memory cells according to the address translation detection signal, wherein the control circuit causes about a half of the output buffer circuits to be set high level and the remaining output buffer circuits to be set low level.

8 Claims, 8 Drawing Sheets

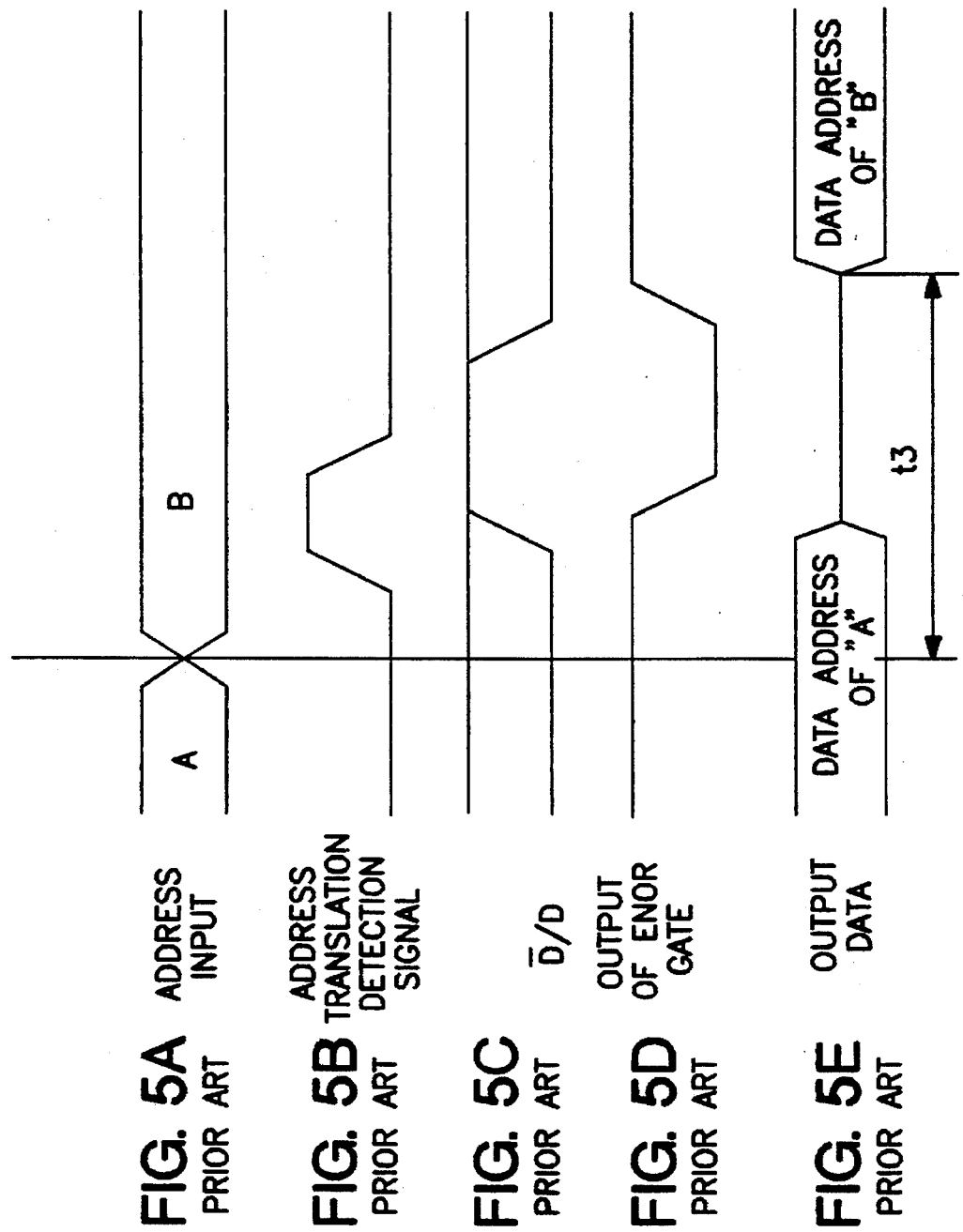
FIG. 5A PRIOR ART ADDRESS INPUT
FIG. 5B PRIOR ART ADDRESS TRANSLATION DETECTION SIGNAL
FIG. 5C PRIOR ART $\overline{D}/D$
FIG. 5D PRIOR ART OUTPUT OF ENOR GATE
FIG. 5E PRIOR ART OUTPUT DATA
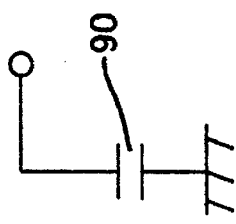
FIG. 6 PRIOR ART

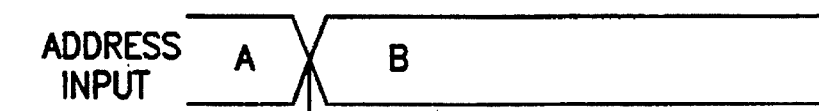
FIG. 10A  ADDRESS INPUT
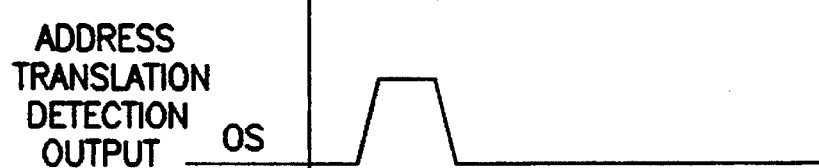
FIG. 10B  ADDRESS TRANSLATION DETECTION OUTPUT  OS
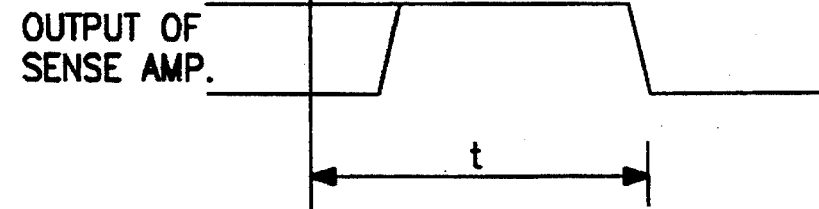
FIG. 10C  OUTPUT OF SENSE AMP.
FIG. 10D  DOE
FIG. 10E  φ
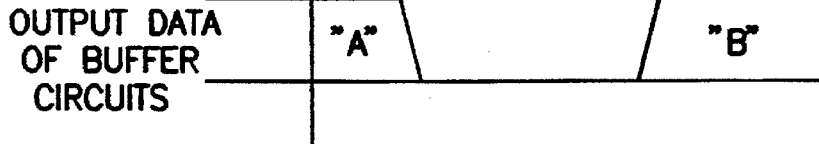
FIG. 10F  OUTPUT DATA OF BUFFER CIRCUITS FIG. 12A ADDRESS INPUT 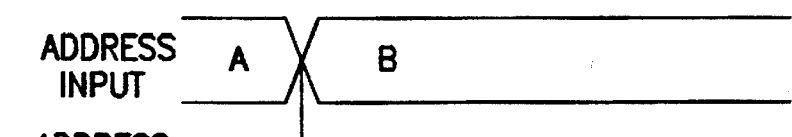
FIG. 12B ADDRESS TRANSLATION DETECTION OUTPUT OS 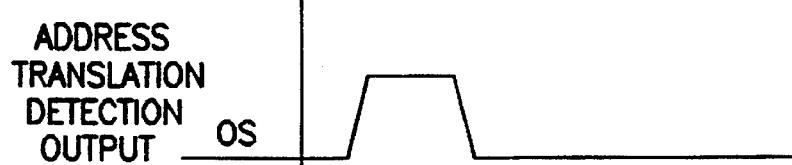
FIG. 12C SENSE AMP. 
FIG. 12D OUTPUT OF ENOR GATE 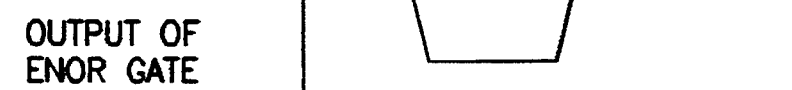
FIG. 12E φ 
FIG. 12F OUTPUT DATA OF BUFFER CIRCUITS 

CONTROL CIRCUIT FOR OUTPUT BUFFER CIRCUITS OF A SEMICONDUCTOR MEMORY DEVICE

BACKGROUND OF THE INVENTION

The present invention relates to a control circuit for controlling an output buffer circuit coupled to an output side of a semiconductor memory which shows a commencement of an access operation when an address translation appears, wherein the output buffer circuit is formed on a semiconductor chip.

In the prior art, there was proposed a conventional control circuit for controlling an output buffer circuit to be used for a semiconductor memory such as static random access memory (SRAM) including CMOS circuits wherein the semiconductor memory shows memory access operations when receipt of an address input detection signal from an address translation detection circuit which detects an address input translation. This conventional control system has a configuration as illustrated in FIG. 1. An output buffer circuit 52 is coupled to an output control circuit 51 for receiving control signals which comprise active/inactive signals. When the output buffer circuit 52 receives the active signal, then the output buffer circuit 52 comes into an active state. When the output buffer circuit 52 receives the inactive signal, then the output buffer circuit 52 comes into an inactive state. The output control circuit 51 is designed to receive a chip enable signal for controlling the active/inactive states of the memory, an output enable signal for controlling enable/unable states of data output operations and a write enable signal for controlling a write operation into memory cells provided in the memory device. The output control circuit 51 receives the inputs of the chip enable signal, the output enable signal and the write enable signals and then performs logic processes to thereby output buffer control signals which will be transmitted into the output buffer circuit 52.

The output buffer is further coupled via a sense amplifier 53 to memory cells for receiving data stored in the memory cells through the sense amplifier 53. The sense amplifier 53 is designed to perform a detection and an amplification of fine signal levels as data stored in the memory cells so that the output buffer 52 receives the memory data with the amplified levels from the memory cells via the sense amplifier 53.

The output buffer circuit 52 performs, according to the output buffer control signal from the output control circuit, to raise a high voltage level of the digital signals from the memory cells via the sense amplifier 53 and subsequently outputs output data on an output terminal not illustrated of the output buffer circuit.

The above described output buffer circuit 52 and the control circuit 51 are engaged with the following problems. The output buffer circuit 52 in a high impedance state is changed so that the output buffer circuit 52 may often output a logic signal "0" corresponding to the previous address and subsequently output a logic signal "1" corresponding to a later address. In such case, a large current may rapidly flow thereby a noise is caused which provides an influence to the circuit performance thereby resulting in a malfunction of the of the circuit.

The above circuit configuration performs without any times necessary for the address access, namely the logic signal "0" with the ground voltage level is rapidly changed to another logic signal "1" with at least the same high voltage level as the power source voltage.

Recently, there has been promoted the increase in the number of bits thereby the number of output buffer circuits 52 is increased up to eight, sixteen or thirty two. When a number of output buffer circuits simultaneously show rapid inversions of the output signals from the logic signal "0" to another logic signal "1", then a considerably large and rapid current flow appears thereby an output signal noise and a power source noise may be generated. This results in the malfunction of the circuits.

To settle the above problems, it has been proposed to use a flip flop circuit for controlling operations of the output buffer circuit wherein the flip flop circuit shows set and reset operations according to control signals comprising an address translation detection signal and a read out signal detection signal so that the output buffer circuit is controlled between in the active state and in the inactive state. This conventional technique is disclosed in the Japanese laid-open patent application No. 63-292483. This conventional circuit configuration is illustrated in FIG. 2. In the circuit configuration, there is provided an address input translation detection circuit 61 designed to receive an address input and detect any address translations. There is further provided a readout detection circuit 62 designed to receive data stored in memory cells and detect the completion of the readout operations from the memory cells. A sense amplifier 63 is coupled to the read out detection circuit 62 for receiving read out detection data from the read out detection circuit 62 and amplifying the received read out detection data. There is further provided a flip flop circuit 64 coupled to the address translation detection circuit 61 for receiving the output data S as a set signal concerning the address translation from the address translation detection circuit 61 and also coupled to the read out detection circuit 62 for receiving the read out detection output signal R as a reset signal from the read out detection circuit 62. There is also provided an output control circuit 65 being coupled to the flip flop circuit 64 for receiving the output of the flip flop circuit 64. The output control circuit 65 is also designed to receive a chip enable signal "CE", an output enable signal "OE" and a write enable signal "WE" to thereby output the output control signals. There is also provided an output buffer circuit 66 which is coupled to the output control circuit 65 for receiving the output control signals for active/inactive states of the output buffer circuit. Namely, the output buffer circuit 66 is controlled by the output control signal from the output control circuit 65 between the active/inactive states. The output buffer circuit 66 in the active state may perform raising up the voltage level of the high level signal received from the sense amplifier 63 and then outputs the output data on the output terminal of the output buffer circuit 66.

FIG. 3 illustrates circuit configurations of the read out detection circuit 62, the flip flop circuit 64 and the output control circuit 65. The read out detection circuit 62 includes first and second sense amplifiers 71 and 72 which are connected in parallel to each other to the sense amplifier 62. Each of the first and second sense amplifiers 71 and 72 is coupled to a single pair of bit lines BL and $\overline{BL}$ coupled to the memory cell array for detecting a voltage difference between the paired bit lines and subsequent amplifications of the detected voltage difference so that the first and second sense amplifiers 71 and 72 show outputs which have inverted phases to each other. First and second sense lines SL and $\overline{SL}$ are coupled to the outputs D and $\overline{D}$ of the first and second sense amplifiers 71 and 72 respectively. A p-channel MOS transistor 73 is coupled between the first and second sense lines SL and $\overline{SL}$ for serving as an equalizer. An exclusive NOR gate 74 has two inputs coupled to the first and second sense lines SL and $\overline{SL}$. The sense amplifier 63 is coupled to the first and second sense lines SL and $\overline{SL}$.

The flip flop circuit 64 comprises first and second NOR gates 75 and 76. The first NOR gate 75 has two inputs, one of which is coupled to an output side of the address translation detection circuit 61 and another input is coupled to an output of the second NOR gate 76. The first NOR gate 75 has a single output coupled to the output control circuit 65. The second NOR gate 76 has two inputs, one of which is coupled to the output of the exclusive NOR gate 74 in the read out detection circuit 62 and another input is coupled to the output of the first NOR gate 75.

The output control circuit 65 comprises a NAND gate having four inputs, the first of which is for receiving the chip enable signal "CE" and the second is for receiving the output enable signal "OE" and further the third of which is for receiving the write enable signal "$\overline{WE}$" as well as the fourth one is coupled to the output of the first NOR gate 75 and the first input of the second NOR gate 76. The NAND gate 65 has an output coupled to the output buffer circuit 66 for supplying the output control signal to the output buffer circuit 66.

FIG. 4 is a circuit diagram illustrative of the output buffer circuit 66 which includes p-channel and n-channel MOS transistors 81 and 82 which are coupled in series to each other between a power source line and a ground line GND and an output terminal is provided between the p-channel and n-channel MOS transistors 81 and 82. Gates of the p-channel and n-channel MOS transistors 81 and 82 are coupled to first and second logic circuits. The first logic circuit comprises a first inverter 83 having an output coupled to the gate of the p-channel MOS transistor 81 and a first NOR gate 85 having an output coupled to an input of the first inverter 83. The first NOR gate 85 has two inputs, one of which is coupled to the sense amplifier 63 and another input being coupled to an output of a third inverter 87 which has an input coupled to the output control circuit for receiving the output control signal. The second logic circuit comprises a second inverter 84 having an output coupled to the gate of the n-channel MOS transistor 82 and a second NOR gate 86 having an output coupled to an input of the second inverter 84. The second NOR gate 86 has two inputs, one of which is coupled to the sense amplifier 63 and another input being coupled to the output control circuit 65 for receiving the output control signal from the output control circuit 65.

FIG. 5 is a timing chart of the circuit illustrated in FIG. 3. When the chip enable signal "CE" is in the enable state, the address input is changed from "A" to "B" thereby the address translation detection circuit 61 generates a high level address translation detection output signal. As a result, the flip flop circuit 64 is set and then outputs a low level output signal thereby the output control circuit 65 generates a high level output signal. As a result, the output buffer circuit 66 comes into the inactive state wherein the output terminal of the output buffer circuit 66 is electrically floated and then, resulting in a high impedance state. The address translation detection output signal causes the memory access operation commenced. According to the address translation detection output signal, a sense line equalize signal $\overline{EQ}$ is generated thereby the transistor 73 turns ON for a time duration. As a result, data D and $\overline{D}$ of the sense lines SL and $\overline{SL}$ are equalized thereby the exclusive NOR gate 74 generates a low level output signal. According to the informations stored in the memory cell corresponding to the address "B", a voltage difference is generated between the single pair of the bit lines BL and $\overline{BL}$. The sense amplifiers 71 and 72 amplify the voltage difference, wherein the outputs of the sense amplifiers 71 and 72 are complements of each other. The exclusive NOR gate 74 generates a high level output signal and thus the flip flop circuit 64 is reset. At this time, the flip flop circuit 64 generates a high level set output. In this case, if the output enable signal "OE" is in the high level and the write enable signal "$\overline{WE}$" is also in the high level where the chip enable signal "CE" is already in the active level or the high level, then the output control circuit 65 generates the low level output signal thereby the output buffer circuit 66 comes into the active state. The output buffer circuit 66 is made active by synchronizing with the read out operation of the data from the memory cells corresponding to the input address "B" an access time t3 after the address translation thereby the output buffer circuit 66 outputs the data stored in the addressed memory cells.

With reference to the Japanese laid-open patent application No. 2-301098, in order to reduce the power for the output buffer circuit and the noise, the output buffer circuit further has a transistor for assessing the output level detector in driving the output level of the output stage. The additional transistor may add an additional driving ability except in the vicinity of a level thereby enabling a high speed output level transition and thus ensuring a high speed access time. In the vicinity of the level, the driving ability of the transistor is decreased according to the output signal from the output level detector to suppress a peak current, resulting in suppressions of any generations of noises on the power source line and the ground line.

The above measures to reduce the power source noise and the output noise is accomplished by causing the output to be in the high impedance state and subsequent change into the low level or the high level. The above measure may allow a problem with increase of the noise particularly when the number of bits is increased and almost all outputs are changed into the low level or the high level. Particularly when the output buffer circuit is positioned far from the ground terminal, the floating of the ground potential is increased. This may allow the influence of the noise.

Normally, the output of the output buffer circuit illustrated in FIG. 4 is received by a gate of a MOS transistor. FIG. 6 illustrates a load equivalent circuit. A capacitor 90 has one terminal being grounded and another terminal being coupled to the output terminal illustrated in FIG. 4 between the p-channel and n-channel MOS transistors 81 and 82. The capacitor 90 may store the data level just before the output buffer circuit comes into the high impedance state according to the output control signal. The data level just before the output buffer circuit comes into the high impedance state according to the output control signal is "1", the data level "1" is stored in the capacitor 90 even after the output buffer circuit comes into the high impedance state. On the other hand, the output buffer circuit comes free from the high impedance state and then outputs the data level "0", the capacitor 90 may allow the charge stored therein flows out thereby a temporary current flows out from the capacitor 90. When there are a large number of output buffer circuits and the load circuits, it may be possible that a considerable large current may flow.

Further, even the high speed access time is ensured, during which a large current flows thereby making it difficult to suppress the noise and increase of the necessary power. In the standby state, the standby current is increased by externally changing the voltage level of the output terminal, for which reason the circuit is not suitable for the static random access memory. In the output level detector, the invertors loaded to the output terminal Dout may often come into the operation by the potential variation of the output terminal even in the standby state.

Accordingly, the issues of the above described prior art to be solved may be regarded as the following four matters. First one is to prevent any generation of the noise due to the operations of the output buffer circuits to thereby prevent any malfunctions of the circuits due to the noise.

Second issue is to reduce the number of invalid transition operations of the output buffer circuits so as to reduce the generation of the noise thereby suppressing any increase of the demanded power.

Third one is to suppress any generation of the rapid large current flow generated by the same operations of a large number of the output buffer circuits.

Fourth one is to prevent any rapid large current flow when the output of the output buffer circuit is received by the gate of the MOS transistor.

SUMMARY OF THE INVENTION

Accordingly, it is an object of the present invention to provide a novel control circuit for controlling operations of an output buffer circuit of a semiconductor memory device, which is free from the problems as described above.

It is a further object of the present invention to provide a novel control circuit for controlling operations of an output buffer circuit of a semiconductor memory device, which is free from the noise caused by the output buffer circuit even when a large number of output buffer circuits are used for a large number of bits.

It is a furthermore object of the present invention to provide a novel control circuit for controlling operations of an output buffer circuit of a semiconductor memory device, which is free from any malfunctions.

It is a still further object of the present invention to provide a novel control circuit for controlling operations of an output buffer circuit of a semiconductor memory device, which is free from any invalid transitional operations of the output buffer.

It is yet a further object of the present invention to provide a novel control circuit for controlling operations of an output buffer circuit of a semiconductor memory device, which is able to suppress a large power consumption.

It is moreover object of the present invention to provide a novel control circuit for controlling operations of an output buffer circuit of a semiconductor memory device, which is able to suppress any generation of the rapid large current flow generated by the same operations of a large number of the output buffer circuits.

It is a further more object the present invention to provide a novel control circuit for controlling operations of an output buffer circuit of a semiconductor memory device, which is able to prevent any rapid large current flow when the output of the output buffer circuit is received by the gate of the MOS transistor.

The present invention may provide a control circuit for controlling a number of output buffer circuits coupled to memory cells for outputting the read out data of the memory cells according to the address translation detection signal, wherein the control circuit causes about a half of the output buffer circuits to be set high level and the remaining output buffer circuits to be set low level.

BRIEF DESCRIPTIONS OF THE DRAWINGS

Preferred embodiments of the present invention will be described in detail with reference to the accompanying drawings.

FIG. 5 is a timing chart of the signals associated with the operations of the conventional output buffer circuit.

FIG. 6 is a circuit diagram illustrative of an equivalent circuit of a load of the output buffer circuit.

FIG. 10 is a timing chart of the signals associated with the operations of the novel output buffer circuit in a first embodiment according to the present invention.

FIG. 12 is a timing chart of the signals associated with the operations of the novel output buffer circuit in a second embodiment according to the present invention.

EMBODIMENTS

Figure 1:
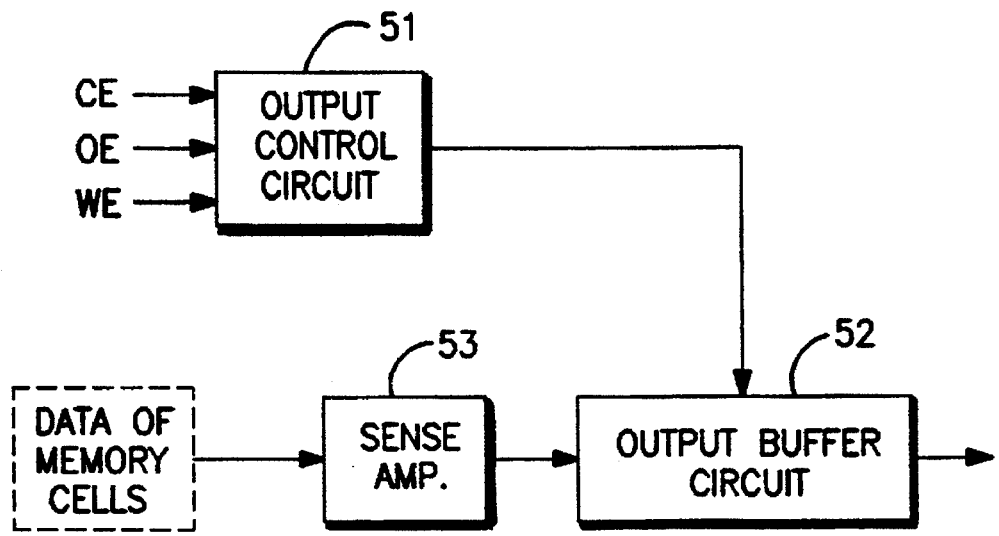
FIG. 1 is a block diagram illustrative of the conventional output buffer circuit configuration.
Figure 2:
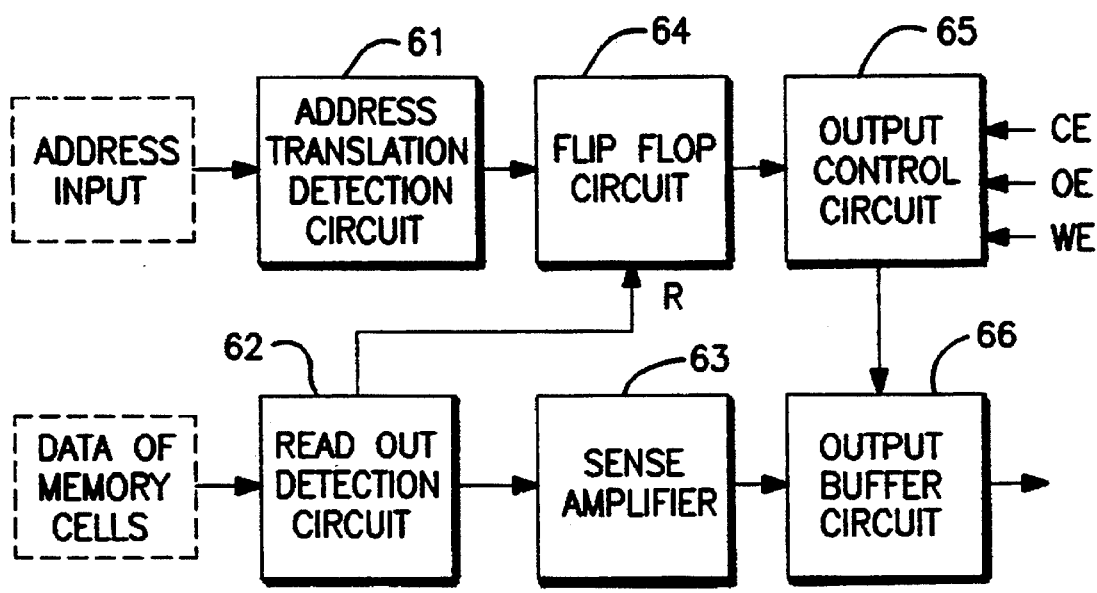
FIG. 2 is a block diagram illustrative of the other conventional output buffer circuit configuration.
Figure 3:
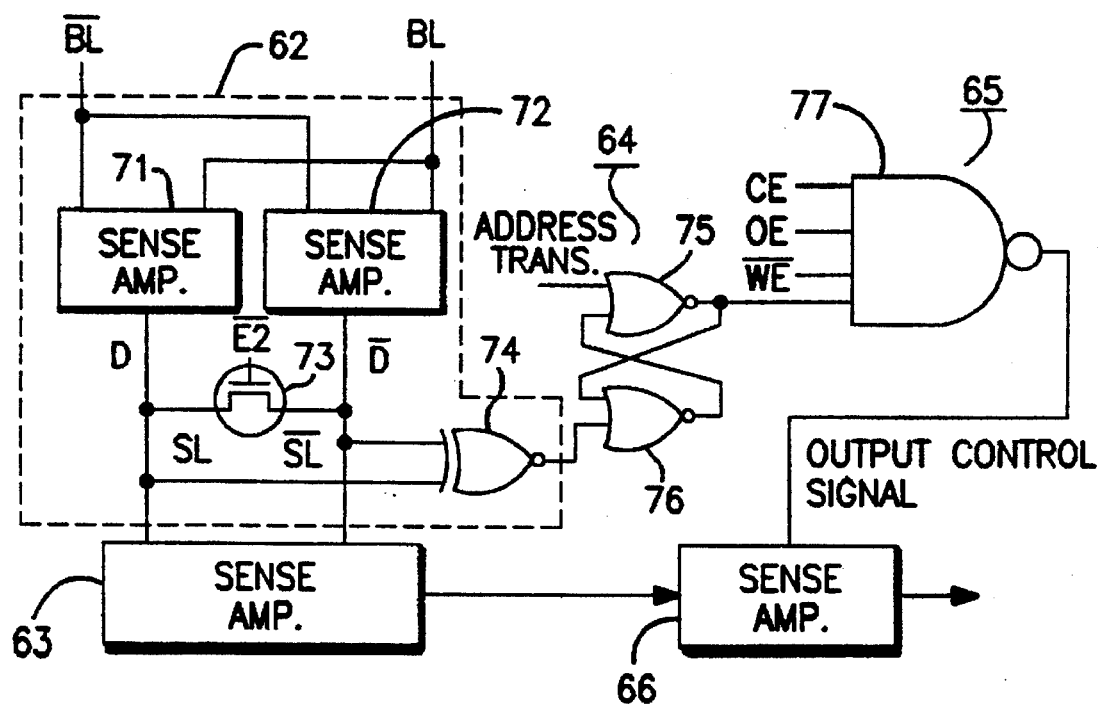
FIG. 3 is a circuit diagram illustrative of an address translation detection circuit, a flip flop circuit and an output control circuit 65 of the other conventional output buffer circuit configuration.
Figure 4:
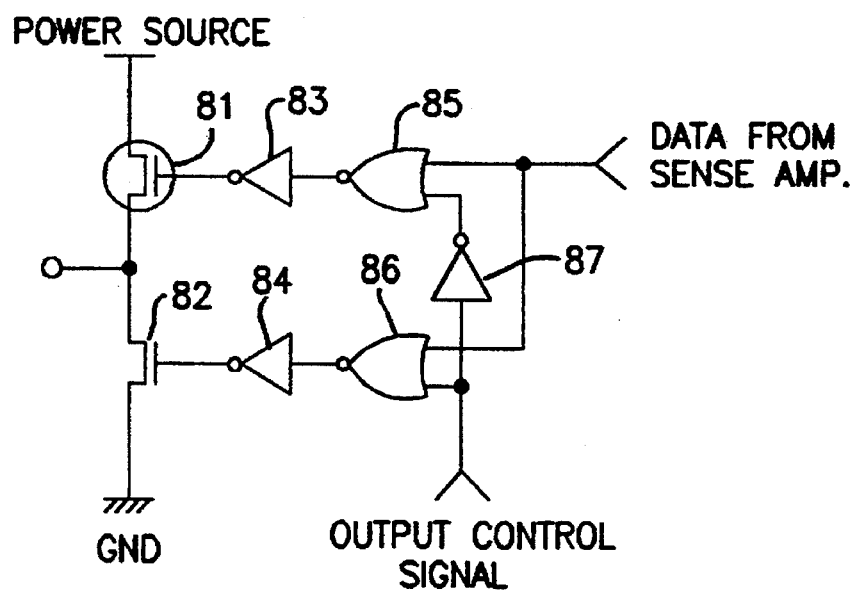
FIG. 4 is a circuit diagram illustrative of the output buffer circuit of the other conventional output buffer circuit configuration.
Figure 7:
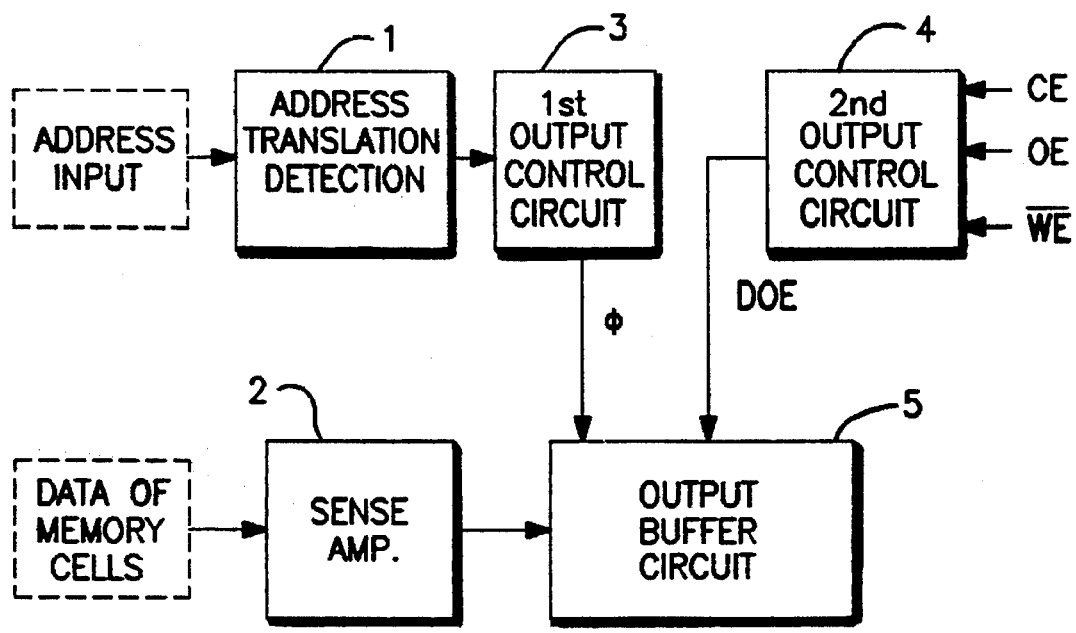
FIG. 7 is a block diagram illustrative of a novel output buffer circuit configuration in a first embodiment according to the present invention.

A first embodiment according to the present invention will be described with reference to FIG. 7 being a block diagram illustrative of a part of a static RAM which commences an access operation according to the address input translation. An address detection circuit 1 is provided to detect the address input translation. A sense amplifier 2 is provided to be coupled to the memory cells for detecting the data from the memory cells and subsequent amplification of the detected data. A first output control circuit 3 is provided to be coupled to the address translation detection circuit 1 for receiving pulse signals from the address translation detection circuit 1 and then adjusting a pulse width of the received pulse signals so as to generate a first output control signal which determines a time during which the output buffer circuit 5 is kept in the high or low level. A second output control circuit 4 is provided for receiving a chip enable signal "CE", an output enable signal "OE" and a write enable signal "WE" and subsequent logical processes so as to generate a second output signal. An output buffer circuit 5 is provided to be coupled to the first and second output control circuits 3 and 4 for receiving the first and second output control signals from the first and second output control circuits 3 and 4 so that the output of the output buffer circuit 5 is set high or low level as well as coupled to the sense amplifier 2 for receiving the output of the sense amplifier 2 and subsequent amplification of the received signals.

The sense amplifier 2 may comprise the well known differential amplifier comprising CMOS transistors. The second output control circuit 4 may comprise logic circuits of three-inputs AND gate which has three inputs respectively receiving the chip enable signal "CE", the output enable signal "OE" and the write enable "WE" and an inverter with an input coupled to an output of the AND gate. Generally, a large number of the output buffers are coupled to output lines of the sense amplifier 2 and the first and second output control circuits 3 and 4.

Figure 8A:
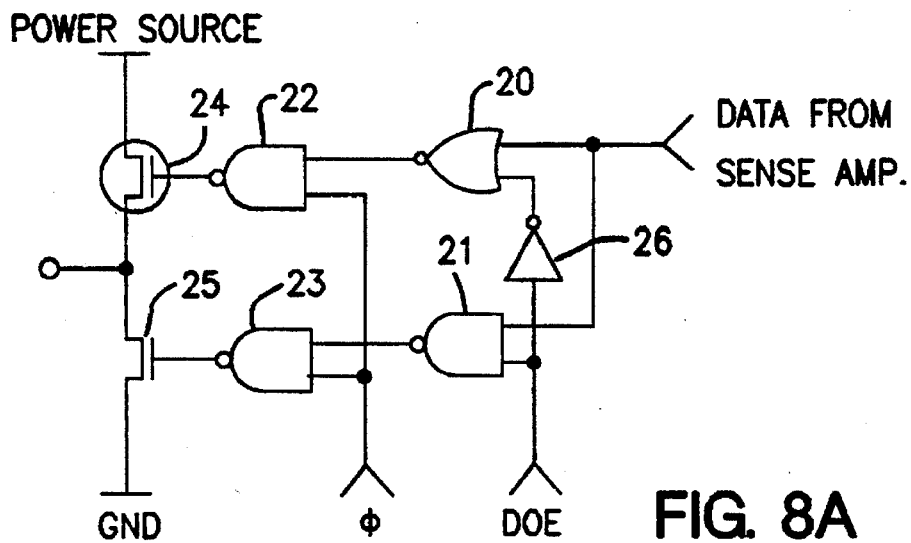
FIG. 8A is a circuit diagram illustrative of a circuit configuration of the output buffer circuit in FIG. 7.

The output buffer circuit 5 may have a logic circuit configuration as illustrated in FIG. 8A. A NOR gate 20 is provided having two inputs, one of which is coupled to the sense amplifier 2 for receiving the output signal of the sense amplifier 2 and another input thereof is coupled to an output of an inverter 26 having an input coupled to the second output control circuit 4 for receiving the output control signal. A first NAND gate 21 is provided having two inputs, one of which is coupled to the sense amplifier 2 for receiving the output signal of the sense amplifier 2 and another input thereof is coupled to the second output control circuit 4 for receiving the output control signal. A second NAND gate 22 is provided having two inputs, one of which is coupled to the output of the NOR gate 20 and another input being coupled to the first output control circuit 3 for receiving the first output control signal from the first output control circuit 3. A third NAND gate 23 is provided having two inputs, one of which is coupled to the output of the first NAND gate 21 and another input being coupled to the first output control circuit 3 for receiving the first output control signal from the first output control circuit 3. A single pair of p-channel and n-channel MOS transistors 24 and 25 are coupled in series between a power source line and a ground line GND. An output of the second NAND gate 22 is coupled to the gate of the p-channel MOS transistor 24. An output of the third NAND gate 23 is coupled to the gate of the n-channel MOS transistor 25. An output terminal of the output buffer circuit 5 is coupled at an intermediate point between the p-channel and n-channel MOS transistors 24 and 25.

Figure 8B:
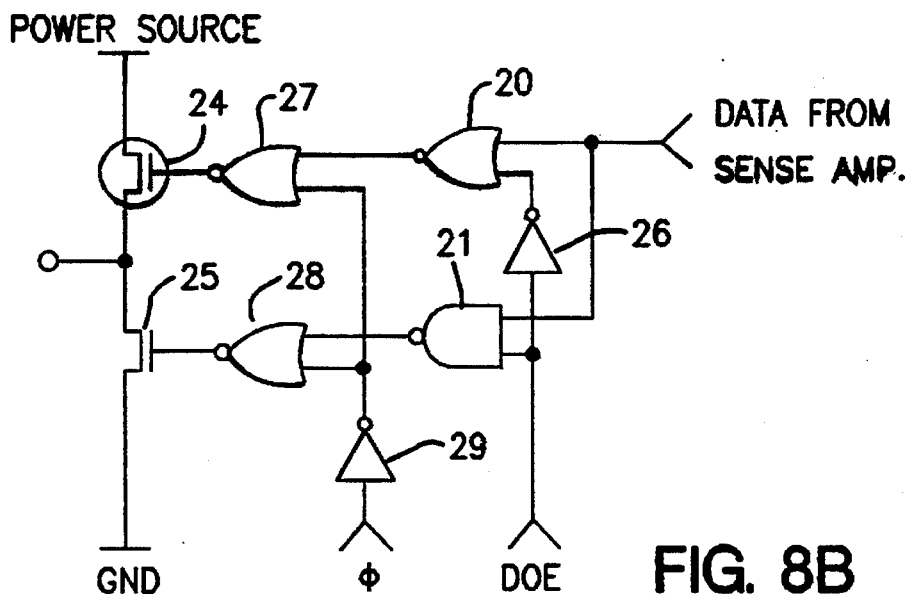
FIG. 8B is a circuit diagram illustrative of another circuit configuration of the output buffer circuit in FIG. 7.

Alternatively, the output buffer circuit 5 may have a logic circuit configuration as illustrated in FIG. 8B. A first NOR gate 20 is provided having two inputs, one of which is coupled to the sense amplifier 2 for receiving the output signal of the sense amplifier 2 and another input thereof is coupled to an output of a first inverter 26 having an input coupled to the second output control circuit 4 for receiving the output control signal. A NAND gate 21 is provided having two inputs, one of which is coupled to the sense amplifier 2 for receiving the output signal of the sense amplifier 2 and another input thereof is coupled to the second output control circuit 4 for receiving the second output control signal. A second NOR gate 27 is provided having two inputs, one of which is coupled to the output of the first NOR gate 20 and another input being coupled via a second invertor 29 to the first output control circuit 3 for receiving the first output control signal from the first output control circuit 3. A third NOR gate 28 is provided having two inputs, one of which is coupled to the output of the NAND gate 21 and another input being coupled via the second invertor 29 to the first output control circuit 3 for receiving the first output control signal from the first output control circuit 3. A single pair of p-channel and n-channel MOS transistors 24 and 25 are coupled in series between a power source line and a ground line GND. An output of the second NOR gate 27 is coupled to the gate of the p-channel MOS transistor 24. An output of the third MOS gate 28 is coupled to the gate of the n-channel MOS transistor 25. An output terminal of the output buffer circuit 5 is coupled at an intermediate point between the p-channel and n-channel MOS transistors 24 and 25.

The above first type output buffer circuit illustrated in FIG. 8A is designed to output signals with inverted voltage levels to those of the output signals of the above second type output buffer circuit illustrated in FIG. 8B. It was confirmed that the use of both the above first and second type output buffer circuits on a single chip would be available. Particularly when a large number of the output buffer circuits are used, it may be preferable to use almost the same number of the first and second type output buffer circuits.

The first type output buffer circuit illustrated in FIG. 8A shows the operations as follows. The data from the sense amplifier 2 and the second output control signal supplied via the inverter 26 from the second output control circuit 4 are inputted into the NOR gate 20 and then the NOR gate 20 outputs the output signal which is inputted into the second NAND gate 22 together with the first output control signal from the first output control circuit 3. The NAND gate 22 generates the output signal which is then transmitted into the gate of the p-channel MOS transistor 24. The data from the sense amplifier 2 is inputted into the first NAND gate 21 together with the second output signal DOE from the second output control circuit 4. The output of the first NAND gate 21 is then inputted into the third NAND gate 23 together with the first output control signal from the first output control circuit 3. The output of the third NAND gate 23 is inputted into the gate of the n-channel MOS transistor 25.

The second type output buffer circuit illustrated in FIG. 8B shows the following operations. The data from the sense amplifier 2 is inputted into the first NOR gate 20 together with the second output control signal DOE supplied via the first inverter 26 from the second output control circuit 4. The output of the NOR gate 20 is inputted into the second NOR gate 27 together with the first output control signal supplied via the second invertor 29 from the first output control circuit 3. The output of the second NOR gate 27 is inputted into the gate of the p-channel MOS transistor 24. The data from the sense amplifier 2 is also inputted into the NAND gate 21 together with the second output control signal from the second output control circuit 4. The output of the NAND gate 21 is inputted into the third NOR gate 28 together with the first output control signal supplied via the second inverter 29 from the first output control circuit 3. The output of the third NOR gate 28 is inputted into the gate of the n-channel MOS transistor 25.

Figure 9:
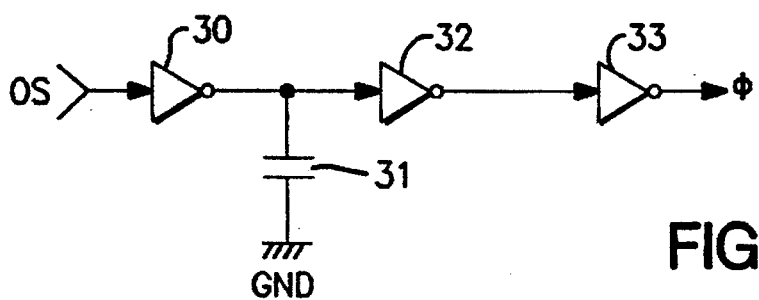
FIG. 9 is a circuit diagram illustrative of a circuit configuration of a first output control circuit in FIG. 7.

The first output control circuit 3 has a circuit configuration illustrated in FIG. 9. The first output control circuit 3 has first to third inverters 30, 32 and 33 connected in series and a capacitor 31. The first inverter 30 has an input coupled to the address translation detection circuit 1 and an output coupled to the input of the second inverter 32. The output of the second inverter 32 is coupled to the input of the third inverter 33 which has an output is coupled to the output buffer circuit 5. The capacitor is provided between the ground line and the input of the second invertor 32 or the output of the first invertor 30 so that a time constant CR is defined by the capacitance of the capacitor 31 and a resistance of the output of the first invertor 30. A width of the pulse signal from the address translation detection circuit 1 is adjusted to depend upon the time constant CR so that the width of the pulse signal is widen.

In order to achieve a high speed operation of the output buffer circuit, the data from the memory cells is amplified in the sense amplifier 2 immediately after the output signal of the sense amplifier is equalized with the equalize signal "EQ" and then the amplified signal is inputted into the output buffer 5. As illustrated in FIG. 10, when the address is changed from "A" to "B", then the data of the memory cell according to the address "A" disappears on the output terminal of the output buffer circuit 5 and after a time interval the data of the memory cell corresponding to the address "B" comes to appear on the output terminal. The data of the memory cell corresponding to the address "B" comes to appear on the output terminal an address access time "t" after the address input is changed from "A" to "B". The address access time "t" may be presumed by a circuit simulation. The first output control circuit 3 plays a roll to generate the first output control signal comprising a pulse signal with such a width that the pulse output signal of the address translation detection circuit 1 has a wider width than the address access time "t".

With reference to the timing chart of FIG. 10, the operation of the output buffer circuit 5 illustrated in FIG. 8A will be described. When the chip enable signal "CE" and the output enable signal "OE" are in the enable states and further the write enable signal "WE" is in the read out state or the high level state, the second output control signal "DOE" is in the high level thereby the data from the sense amplifier 2 is activated. In this case, when the address input is changed from "A" to "B", then the address translation detection circuit 1 generates the high level pulse signal as the address translation detection output signal thereby the first output control signal of the first output control circuit 3 comes into the low level. As a result, the output of the output buffer circuit 5 is kept in the low level. Subsequently, the address translation may cause the memory access operation to be commenced thereby the memory cell corresponding to the address "B" is specified. Thus, the data of the specified memory cell are transmitted via the sense amplifier 2 to the output buffer 5, while the address access time "t" is consumed. The first output control signal of the first output control circuit 3 returns to the high level the address access time "t" after the address translation has appeared. As a result, the output buffer circuit 5 comes into the active state so that the data of the memory cell corresponding to the address "B" is outputted onto the output terminal of the output buffer circuit 5.

The operations of the output buffer circuit 5 illustrated in FIG. 8B are the same except that when the first output control signal of the first output control circuit 3 is low level, the output of the output buffer circuit 5 is kept in the high level.

Figure 11:
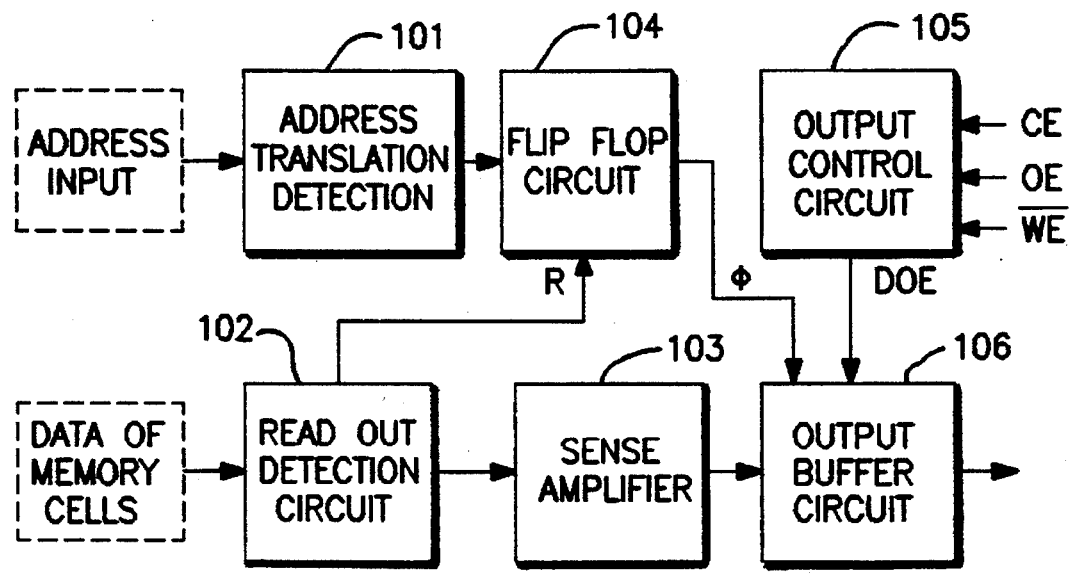
FIG. 11 is a block diagram illustrative of a novel output buffer circuit configuration in a second embodiment according to the present invention.

A second embodiment according to the present invention will be described in which another novel output buffer circuit is provided. FIG. 11 illustrates a circuit configuration of the semiconductor memory. An output buffer circuit 106 is provided having either the logic circuit configuration illustrated in FIG. 8A or 8B. There is provided an address translation detection circuit 101 designed to receive the address input and output the address translation detection signal. A read out detection circuit 102 is provided for receiving the data from the memory cells and generating the read out detection signal. A sense amplifier 103 is provided to be coupled to the read out detection circuit 102 to receive the read out detection circuit 102 for subsequent amplification of the received read out detection signal. A flip flop circuit 104 is provided to be coupled to the address translation detection circuit 101 for receiving the address translation detection signal as well as coupled to the read out detection circuit 102 for receiving the read out detection signal. The output buffer circuit 106 is provided to be coupled to the sense amplifier 103 for receiving the amplified data of the memory cells and coupled to the flip flop circuit 104 for receiving the output of the flip flop circuit 104 as a first output control signal as well as coupled to an output control circuit 105 for receiving an output control signal of the output control circuit 105 as a second output control signal. The output control circuit 105 is designed to receive the chip enable signal "CE", the output enable signal "OE" and the write enable signal "RE". The output of the address translation detection circuit 101 is introduced into the flip flop circuit 104 as a set signal and the output of the read out detection signal is introduced into the flip flop circuit 104 as a reset signal.

FIG. 12 is a timing chart of the operations of the circuit in the second embodiment according to the present invention. The address translation detection signal and the read out detection signal comprising the output of the exclusive NOR gate are inputted into the flip flop circuit 104 and then the flip flop circuit 104 outputs the first output control signal having the same signal as that of the first output control circuit 3 of the first embodiment according to the present invention. As a result, the wave forms of the individual signals of the circuits illustrated in FIG. 12 are the same as those illustrated in FIG. 10 of the first embodiment according to the present invention.

According to the present invention, the output buffer circuit is so designed that the data of the memory cell appears on the output terminal of the output buffer circuit immediately after the output buffer circuit is set at the high or low level.

Figure 13:
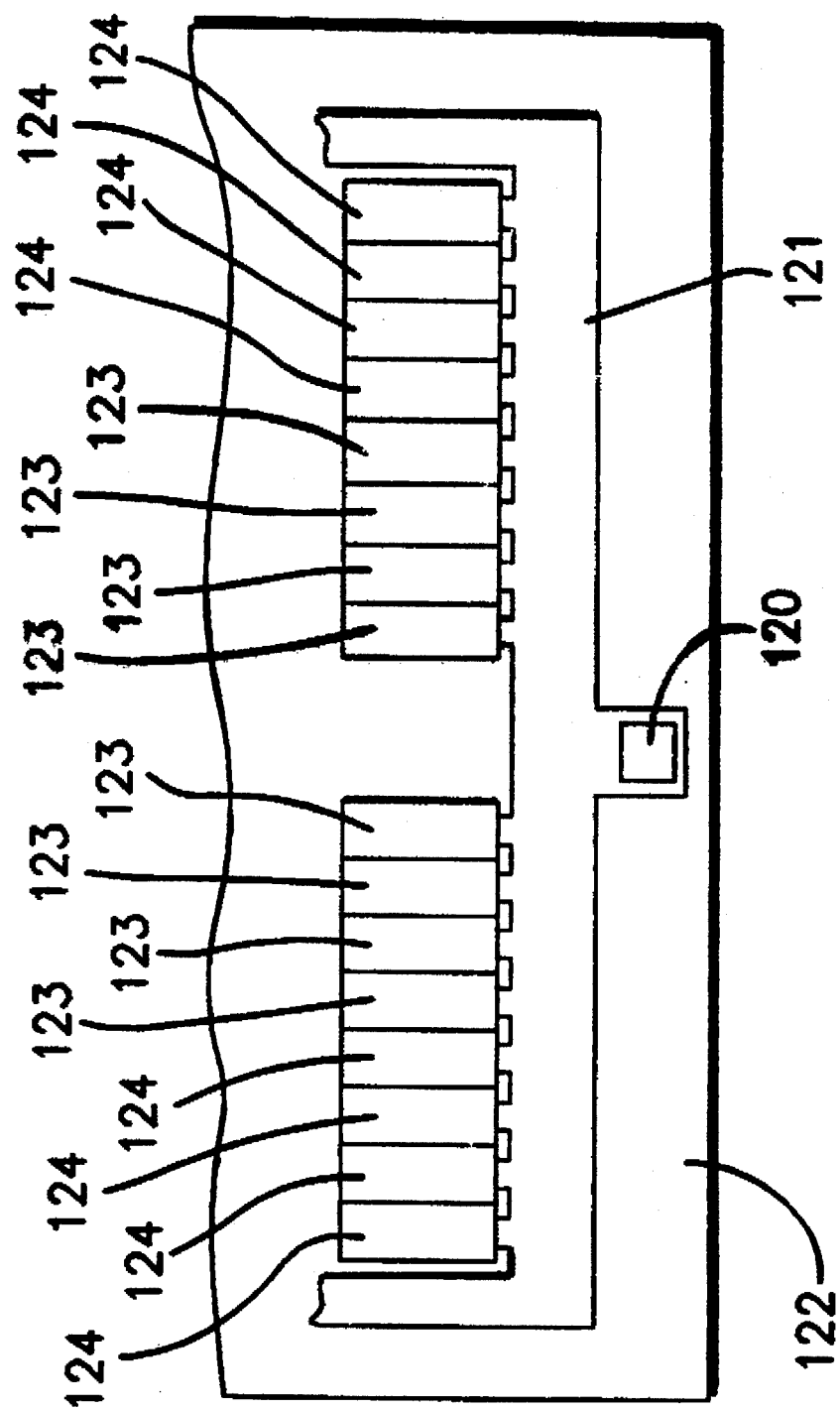
FIG. 13 is a view illustrative of output buffer circuits arranged on a semiconductor chip according to the present invention.

FIG. 13 is illustrative of a structure of the semiconductor static random access memory having sixteen output buffers. On a main face of a semiconductor substrate 122, there are formed a ground potential pad 120 coupled to the ground line and an aluminum wiring 121 connecting the ground potential pad 120 to individuals of the sixteen output buffer circuits 123 and 124. The sixteen output buffer circuits are positioned to be divided into a right half section and a left half section. The sixteen output buffer circuits comprise eight of the second type output buffer circuits 123, each of which is illustrated in FIG. 8A and eight of the first type output buffer circuits 124, each of which are illustrated in FIG. 8B. In the right half section, four of the second type output buffer circuits 123 are positioned inside and four of the first type output buffer circuits 124 are positioned output. In the left half section, four of the second type output buffer circuits 123 are positioned inside and four of the first type output buffer circuits 124 are positioned output. The first type output buffer circuit 123 is set high level when receiving the high level of the first output control signal and the second type output buffer circuit 124 is set low level when receiving the high level of the first output control signal.

Accordingly, when the first output control signal is in the high level or the valid level, the first type output buffer circuits 124 positioned outside are set at the low level and the second type output buffer circuits 123 positioned inside are set at the high level. For that reason, all of the output levels of the output buffer circuits are in the low level, a temporally current flow appears only on the second type output buffer circuits 123 thereby the degree of floating of the voltage level from the ground potential is reduced into a half. For that reason, even if the write operation is carried out just after the output appears, there is no possibility of error write operation due to the reduced floating degree. The first type output buffer circuits 124 positioned far from the ground potential pad 120 are in the low level state, while the second type output buffer circuits 123 positioned near the ground potential pad 120 are in the high level. The first type output buffer circuits 124 comes into the low level from the high level where the second type output buffer circuits 123 have been already in the low level state. As a result, the rapid current flow may be reduced into a half of the current flow when all the output buffer circuits are the same type. Even immediately after the low level read out operation, the write operation is performed, the second type output buffer circuits 123 only comes into the low level. The second output buffer circuits 123 have a low wiring impedance due to the position near to the ground pad 120. The low wiring impedance may suppress the noise level to be low thereby causing the output buffer circuits to be free from the noise in the write operation. Assuming that the peak current of each of the output buffer circuits is 8 mA, the actual peak current may be computed to 64 mA.

The positions of the first and second type output buffer circuits 124 and 123 may be reversed.

Whereas modifications of the present invention will be apparent to a person having ordinary skill in the art, to which the invention pertains, it is to understood that embodiments shown and described by way of illustrations are by no means intended to be considered in a limiting sense. Accordingly, it is to be intended to cover by claims all modifications which fall within the spirit and scope of the present invention.

What is claimed is:

1. A control circuit for controlling a plurality of output buffer circuits used for read out operations of a semiconductor memory device, wherein said control circuit sets a first group of said plurality of output buffer circuits at a low level and remaining output buffer circuits at a high level for subsequent read out operation of data stored in memory cells in said semiconductor memory device;

said first group of said plurality of output buffer circuits have logic circuits of a first type which have input terminals receiving a chip enable signal, an output enable signal and a write enable signal;

said remaining output buffer circuits have logic circuits of a second type;

said chip enable, output enable, and write enable signals control said first type logic circuits between active/inactive states, and outputs of said first type logic circuits are driven low for said subsequent read out operation; and said first type logic circuit of said output buffer circuits comprises:

a NOR gate having two inputs, one of which is coupled to a sense amplifier for receiving an output signal of said sense amplifier and another input thereof is coupled to an output of an inverter having an input coupled to a second output control circuit for receiving a second output control signal;

a first NAND gate having two inputs, one of which is coupled to said sense amplifier for receiving said output signal of said sense amplifier and another input thereof is coupled to the second output control circuit for receiving the output control signal;

a second NAND gate having two inputs, one of which is coupled to an output of a NOR gate and another input being coupled to said first output control circuit for receiving said first output control signal from the first output control circuit;

a third NAND gate having two inputs, one of which is coupled to said output of said first NAND gate and another input being coupled to the first output control circuit for receiving the first output control signal from said first output control circuit; and a single pair of p-channel and n-channel MOS transistors are coupled in series between a power source line and a ground line so that an output of said second NAND gate is coupled to the gate of the p-channel MOS transistor and an output of the third NAND gate is coupled to the gate of the n-channel MOS transistor as well as an output terminal of the output buffer circuit is coupled at an intermediate point between the p-channel and n-channel MOS transistors.

2. The control circuit as claimed in claim 1, wherein said second type logic circuit of said output buffer circuits comprises:

a first NOR gate having two inputs, one of which is coupled to the sense amplifier for receiving the output signal of the sense amplifier and another input thereof is coupled to an output of a first inverter having an input coupled to the second output control circuit for receiving the output control signal;

a NAND gate having two inputs, one of which is coupled to the sense amplifier for receiving the output signal of the sense amplifier and another input thereof is coupled to the second output control circuit for receiving the second output control signal;

a second NOR gate having two inputs, one of which is coupled to the output of the first NOR gate and another input being coupled via a second inverter to the first output control circuit for receiving the first output control signal from the first output control circuit;

a third NOR gate having two inputs, one of which is coupled to the output of the NAND gate and another input being coupled via the second inverter to the first output control circuit for receiving the first output control signal from the first output control circuit; and a single pair of p-channel and n-channel MOS transistors are coupled in series between a power source line and a ground line so that an output of the second NOR gate is coupled to the gate of the p-channel MOS transistor and output of the third MOS gate is coupled to the gate of the n-channel MOS transistor as well as an output terminal of the output buffer circuit is coupled at an intermediate point between the p-channel and n-channel MOS transistors.

3. The control circuit as claimed in claim 2, wherein the number of said first type logic circuits of said output buffer circuits are the same as the number of a second type logic circuits of said output buffer circuits.

4. The control circuit as claimed in claim 3, wherein said second type logic circuits of said output buffer circuits are positioned nearer a ground potential pad than are said first type logic circuits of said output buffer circuits.

5. A control circuit for controlling a plurality of output buffer circuits used for read out operations of a semiconductor memory device, wherein said control circuit sets a first group of said plurality of output buffer circuits at a high level and remaining output buffer circuits at a low level for subsequent read out operation of data stored in memory cells in said semiconductor memory device;

said first group of said plurality of output buffer circuits have logic circuits of a first type which have input terminals receiving a chip enable signal, an output enable signal and a write enable signal;

said remaining output buffer circuits have logic circuits of a second type;

said chip enable, output enable, and write enable signals control said first type logic circuits between active/inactive states, and outputs of said first type logic circuits are driven high for said subsequent read out operation; and said first type logic circuit of said output buffer circuits comprises:

a first NOR gate having two inputs, one of which is coupled to the sense amplifier for receiving the output signal of the sense amplifier and another input thereof is coupled to an output of a first inverter having an input coupled to the second output control circuit for receiving the output control signal;

a NAND gate having two inputs, one of which is coupled to the sense amplifier for receiving the output signal of the sense amplifier and another input thereof is coupled to the second output control circuit for receiving the second output control signal;

a second NOR gate having two inputs, one of which is coupled to the output of the first NOR gate and another input being coupled via a second inverter to the first output control circuit for receiving the first output control signal from the first output control circuit;

a third NOR gate having two inputs, one of which is coupled to the output of the NAND gate and another input being coupled via the second inverter to the first output control circuit for receiving the first output control signal from the first output control circuit; and a single pair of p-channel and n-channel MOS transistors are coupled in series between a power source line and a ground line so that an output of the second NOR gate is coupled to the gate of the p-channel MOS transistor and output of the third MOS gate is coupled to the gate of the n-channel MOS transistor as well as an output terminal of the output buffer circuit is coupled at an intermediate point between the p-channel and n-channel MOS transistors.

6. The control circuit as claimed in claim 5, wherein said second type logic circuit of said output buffer circuits comprises:

a NOR gate having two inputs, one of which is coupled to a sense amplifier for receiving an output signal of said sense amplifier and another input thereof is coupled to an output of an inverter having an input coupled to a second output control circuit for receiving a second output control signal;

a first NAND gate having two inputs, one of which is coupled to said sense amplifier for receiving said output signal of said sense amplifier and another input thereof is coupled to the second output control circuit for receiving the output control signal;

a second NAND gate having two inputs, one of which is coupled to an output of a NOR gate and another input being coupled to said first output control circuit for receiving said first output control signal from the first output control circuit;

a third NAND gate having two inputs, one of which is coupled to said output of said first NAND gate and another input being coupled to the first output control circuit for receiving the first output control signal from said first output control circuit; and a single pair of p-channel and n-channel MOS transistors are coupled in series between a power source line and a ground line so that an output of said second NAND gate is coupled to the gate of the p-channel MOS transistor and an output of the third NAND gate is coupled to the gate of the n-channel MOS transistor as well as an output terminal of the output buffer circuit is coupled at an intermediate point between the p-channel and n-channel MOS transistors.

7. The control circuit as claimed in claim 6, wherein the number of said first type logic circuits of said output buffer circuits are the same as the number of a second type logic circuits of said output buffer circuits.

8. The control circuit as claimed in claim 7, wherein said first type logic circuits of said output buffer circuits are positioned nearer a ground potential pad than are said second type logic circuits of said output buffer circuits.

* * * * *